US011767609B2

(12) United States Patent
Hashimoto

(10) Patent No.: US 11,767,609 B2
(45) Date of Patent: Sep. 26, 2023

(54) LOW-DISLOCATION BULK GAN CRYSTAL AND METHOD OF FABRICATING SAME

(71) Applicant: SixPoint Materials, Inc., Buellton, CA (US)

(72) Inventor: Tadao Hashimoto, Santa Barbara, CA (US)

(73) Assignee: SixPoint Materials, Inc., Buellton, CA (US)

( * ) Notice: Subject to any disclaimer, the term of this patent is extended or adjusted under 35 U.S.C. 154(b) by 369 days.

(21) Appl. No.: 17/306,239

(22) Filed: May 3, 2021

(65) Prior Publication Data

US 2021/0355598 A1 Nov. 18, 2021

Related U.S. Application Data

(63) Continuation-in-part of application No. 16/271,325, filed on Feb. 8, 2019, now abandoned.

(60) Provisional application No. 62/628,862, filed on Feb. 9, 2018.

(51) Int. Cl.
*C30B 7/10* (2006.01)
*C25F 3/12* (2006.01)
*C30B 29/40* (2006.01)

(52) U.S. Cl.
CPC ........ *C30B 7/105* (2013.01); *C25F 3/12* (2013.01); *C30B 29/406* (2013.01)

(58) Field of Classification Search
CPC ........ C30B 29/406; C30B 7/005; C30B 7/105
See application file for complete search history.

(56) References Cited

U.S. PATENT DOCUMENTS

| 6,656,615 | B2 | 12/2003 | Dwilinski et al. |
| 7,078,731 | B2 | 7/2006 | D'Evelyn et al. |
| 7,132,730 | B2 | 11/2006 | Dwilinski et al. |
| 7,160,388 | B2 | 1/2007 | Dwilinski et al. |
| 8,236,267 | B2 | 8/2012 | Hashimoto et al. |
| 9,790,617 | B2 | 10/2017 | Hashimoto et al. |
| 9,909,230 | B2 | 3/2018 | Hashimoto et al. |
| 2004/0067648 | A1 | 4/2004 | Morita et al. |
| 2004/0089919 | A1* | 5/2004 | Motoki ............ H01L 21/02458 257/E21.127 |

(Continued)

FOREIGN PATENT DOCUMENTS

| JP | 2003-142414 | 5/2003 |
| WO | WO2007/008198 A1 | 1/2007 |

(Continued)

OTHER PUBLICATIONS

Mathis, S.K. et al., "Modeling of Threading Dislocation Reduction in Growing GaN Layers", Elsevier Science B.V., Journal of Crystal Growth, vol. 231, 2001, pp. 371-390.

(Continued)

*Primary Examiner* — Matthew J Song
(74) *Attorney, Agent, or Firm* — STRATEGIC INNOVATION IP LAW OFFICES, P.C.

(57) ABSTRACT

GaN wafers and bulk crystal have dislocation density approximately ¹/₁₀ of dislocation density of seed used to form the bulk crystal and wafers. Masks are formed selectively on GaN seed dislocations, and new GaN grown on the seed has fewer dislocations and often ¹/₁₀ or less of dislocations present in seed.

15 Claims, 2 Drawing Sheets

(56) References Cited

U.S. PATENT DOCUMENTS

| | | | |
|---|---|---|---|
| 2007/0125996 A1* | 6/2007 | Morita | C30B 25/02 257/11 |
| 2007/0234946 A1 | 10/2007 | Hashimoto et al. | |
| 2007/0259504 A1 | 11/2007 | Bour et al. | |
| 2009/0194848 A1 | 8/2009 | Uemura et al. | |
| 2010/0133548 A1 | 6/2010 | Arena et al. | |
| 2014/0027789 A1 | 1/2014 | Katona et al. | |
| 2014/0065360 A1 | 3/2014 | D'Evelyn et al. | |
| 2014/0332833 A1 | 11/2014 | Kim | |
| 2017/0327971 A1* | 11/2017 | Fujisawa | C30B 29/406 |
| 2019/0249333 A1 | 8/2019 | Hashimoto | |

FOREIGN PATENT DOCUMENTS

| | | |
|---|---|---|
| WO | WO2007/117689 A2 | 10/2007 |
| WO | WO2019/157313 A1 | 8/2019 |

OTHER PUBLICATIONS

Zhuang, D. et al., "Wet Etching of GaN, AlN, and SiC: a Review", Materials Science and Engineering R48, Jan. 20, 2005, pp. 1-46, doi:10.1016/j.mser.2004.11.002.

Weyher, J.L. et al., "Characterization of GaN Single Crystals by Defect-Selective Etching", Phys. Stat. Sol. (c), No. 3, Feb. 6, 2003, pp. 821-826, doi:10.1002/pssc.200306248.

PCT/US2019/017260 International Search Report and Written Opinion dated Jun. 4, 2019, pp. 12.

Sundararajan, et al., "Gallium Nitride: Method of Defect Characterization by Wet Oxidation in an Oxalic Acid Electrolytic Cell", Journal of Vacuum Science and Technology, vol. 20, No. 4, Jul. 1, 2002, pp. 1339-1341, XP012009393.

U.S. Appl. No. 16/271,325 Restriction Requirement dated Mar. 25, 2021.

U.S. Appl. No. 16/271,325 Amendment dated Apr. 20, 2021.

U.S. Appl. No. 16/271,325 Office Action dated Apr. 28, 2021.

* cited by examiner

LOW-DISLOCATION BULK GAN CRYSTAL AND METHOD OF FABRICATING SAME

CROSS REFERENCE TO RELATED APPLICATIONS

This application is a continuation-in-part of U.S. application Ser. No. 16/271,325 filed Feb. 8, 2019, which claims the benefit of priority to U.S. Provisional Patent Application No. 62/628,862 filed Feb. 9, 2018, having the same title and inventors as this application, the entire contents of each of which are incorporated by reference herein as if put forth in full below.

This application is related to the following U.S. patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,";

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,", which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,";

U.S. Utility Patent Application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD,";

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,";

U.S. Utility Patent Application Ser. No. 61/067,117, filed on Feb. 25, 2008, by Tadao Hashimoto, Edward Letts, Masanori Ikari, entitled "METHOD FOR PRODUCING GROUP III-NITRIDE WAFERS AND GROUP III-NITRIDE WAFERS,";

U.S. Utility Patent Application Ser. No. 61/058,900, filed on Jun. 4, 2008, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,";

U.S. Utility Patent Application Ser. No. 61/058,910, filed on Jun. 4, 2008, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL," and issued as U.S. Pat. No. 8,236,237;

U.S. Utility Patent Application Ser. No. 61/131,917, filed on Jun. 12, 2008, by Tadao Hashimoto, Masanori Ikari, Edward Letts, entitled "METHOD FOR TESTING III-NITRIDE WAFERS AND III-NITRIDE WAFERS WITH TEST DATA,";

U.S. Utility Patent Application Ser. No. 61/106,110, filed on Oct. 16, 2008, by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS,";

U.S. Utility Patent Application Ser. No. 61/694,119, filed on Aug. 28, 2012, by Tadao Hashimoto, Edward Letts, Sierra Hoff, entitled "GROUP III NITRIDE WAFER AND PRODUCTION METHOD,";

U.S. Utility Patent Application Ser. No. 61/705,540, filed on Sep. 25, 2012, by Tadao Hashimoto, Edward Letts, Sierra Hoff, entitled "METHOD OF GROWING GROUP III NITRIDE CRYSTALS,";

U.S. Utility Patent Application Ser. No. 62/002,488, filed on May 23, 2014, by Tadao Hashimoto, Edward Letts, entitles "GROUP III NITRIDE BULK CRYSTALS AND THEIR FABRICATION METHOD,";

U.S. Utility Patent Application Ser. No. 62/106,709, filed on Jan. 22, 2015, by Tadao Hashimoto, Edward Letts, Daryl key, entitles "SEED SELECTION AND GROWTH METHODS FOR REDUCED-CRACK GROUP III NITRIDE BULK CRYSTALS,".

which applications are incorporated by reference herein in their entirety as if put forth in full below.

BACKGROUND

Field of the Invention

The invention relates to bulk crystals of gallium nitride (GaN) and their fabrication method. Bulk crystals of GaN are sliced into semiconductor wafers to produce various devices including optoelectronic devices such as light emitting diodes (LEDs) and laser diodes (LDs), and electronic devices such as transistors. More specifically, the invention provides bulk GaN crystals having low-dislocations.

Description of the Existing Technology

This document refers to several publications and patents as indicated with numbers within brackets, e.g., [x]. Following is a list of these publications and patents:

[1] R. Dwiliński, R. Doradziński, J. Garczyński, L. Sierzputowski, Y. Kanbara, U.S. Pat. No. 6,656,615.

[2] R. Dwiliński, R. Doradziński, J. Garczyński, L. Sierzputowski, Y. Kanbara, U.S. Pat. No. 7,132,730.

[3] R. Dwiliński, R. Doradziński, J. Garczyński, L. Sierzputowski, Y. Kanbara, U.S. Pat. No. 7,160,388.

[4] K. Fujito, T. Hashimoto, S. Nakamura, International Patent Application No. PCT/US2005/024239, WO07008198.

[5] T. Hashimoto, M. Saito, S. Nakamura, International Patent Application No. PCT/US2007/008743, WO07117689. See also US20070234946, U.S. application Ser. No. 11/784,339 filed Apr. 6, 2007.

[6] D'Evelyn, U.S. Pat. No. 7,078,731.

[7] S. K. Mathis, A. E. Romanov, L. F. Chen, G. E. Beltz, W. Pompe, J. S. Speck, "Modeling of threading dislocation reduction in growing GaN layers," J. Cryst. Growth 231 (2001) 37.

[8] D. Zhuang, J. H. Edgar, "Wet etching of GaN, AlN, and SiC: a review," Materials Science and Engineering R48 (2005) 1-46.

[9] J. L. Weyher, L. Macht, G. Kamler, J. Borysiuk, and I. Grzegory, "Characterization of GaN single crystals by defect-selective etching," Phys. Stat. Sol. (c) (2003) 821.

Each of the references listed in this document is incorporated by reference in its entirety as if put forth in full herein, and particularly with respect to their description of a low-dislocation bulk GaN crystal and its fabrication method.

GaN and its related group III nitride alloys are the key material for various optoelectronic and electronic devices such as LEDs, LDs, microwave power transistors, and solar-blind photo detectors. Currently LEDs are widely used in displays, indicators, general illuminations, and LDs are used in data storage disk drives. However, the majority of these devices are grown epitaxially on heterogeneous substrates, such as sapphire and silicon carbide because GaN substrates are extremely expensive compared to these heteroepitaxial substrates. The heteroepitaxial growth of group III nitride causes highly defected or even cracked films, which hinder the realization of high-end optical and electronic devices, such as high-brightness LEDs for general lighting or high-power microwave transistors.

To solve the fundamental problems caused by heteroepitaxy, it is indispensable to utilize GaN wafers sliced from bulk GaN crystals. For the majority of devices, GaN wafers are favored because it is relatively easy to control the conductivity of the wafer and GaN wafer will provide the smallest lattice/thermal mismatch with device layers. However, due to the high melting point and high nitrogen vapor pressure at elevated temperature, it has been difficult to grow GaN crystal ingots and slice them into wafers. Currently, the GaN wafers available in the market are mainly free-standing GaN wafers produced by a method called hydride vapor phase epitaxy (HVPE). State of the art HVPE free-standing GaN wafers are produced by growing a thick GaN layer on a heteroepitaxial substrate such as sapphire and gallium arsenide, which is subsequently removed to make the layer free-standing. Due to problems inherent in this "quasi-bulk" method, it is difficult to reduce dislocation density to a value less than $10^6$ cm$^{-2}$.

To obtain high-quality GaN wafers for which dislocation density is less than $10^6$ cm$^{-2}$, various growth methods such as ammonothermal growth, flux growth, high-temperature solution growth have been developed. Ammonothermal method grows GaN bulk crystals in supercritical ammonia [1-6]. The flux method and the high-temperature solution growth use a melt of group III metal.

Recently, high-quality GaN substrates having dislocation density on the order of $10^5$ cm$^{-2}$ can be obtained by the ammonothermal growth by using HVPE-grown seed crystals having dislocation density on the order of $10^6$ cm$^{-2}$. Although the detailed mechanism is unknown, by growing thick, bulk crystals, pairs of dislocations having opposite Burger's vector seem to naturally annihilate each other from $10^6$ cm$^{-2}$ down to $10^5$ cm$^{-2}$. However, this natural annihilation does not occur below $10^5$ cm$^{-2}$ because the probability of dislocation pairs meeting becomes exceedingly low. To further reduce dislocation density, the present invention discloses an innovative method to terminate individual dislocations in the ammonothermal growth without relying on pairs annihilating one another.

SUMMARY OF THE INVENTION

In one instance, low-dislocation bulk GaN in this invention is composed of a first region containing a seed crystal, a second region of ammonothermally grown GaN, and metal particles or masks at termination points of dislocations at an interface between the first region and the second region. The dislocation density of the first region is preferably less than or equal to $10^6$ cm$^{-2}$ and the dislocation density of the second region is preferably less than $\frac{1}{10}$ of the dislocation density of the first region.

The invention also provides a method of fabricating a low-dislocation bulk GaN crystal. A seed crystal is etched to form pits at the surface termination point of dislocations on the nitrogen polar c-plane. Then, a metal layer is deposited on the etched surface of the seed and the layer is mechanically removed to create metal fillings in the pits. Finally, bulk GaN is grown in supercritical ammonia to obtain a low-dislocation bulk GaN crystal.

The invention also provides a method of fabricating a low-dislocation bulk GaN crystal. A seed crystal is etched to form pits at the surface termination point of dislocations on the nitrogen polar c-plane. Then, metal masks are selectively formed in the pits. Finally, bulk GaN is grown in supercritical ammonia to obtain a low-dislocation bulk GaN crystal.

BRIEF DESCRIPTION OF THE DRAWINGS

Referring now to the drawings in which like reference numbers represent corresponding parts throughout.

Figure 1:
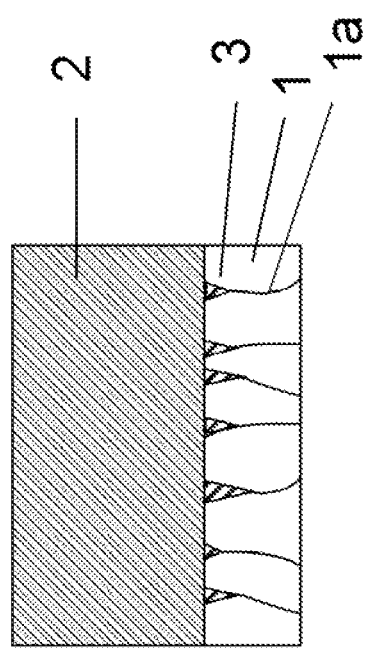
FIG. 1 is a schematic drawing of the bulk crystal.

In the figure each number represents the followings:
1. A first region (a seed crystal),
1a. A dislocation in the seed crystal,
2. A second region grown in supercritical ammonia,
3. A metal located at the termination point of a dislocation in the interface between the first region and the second region.

FIG. 2 is a schematic drawing of the fabrication process of the bulk crystal depicted at steps A-E during fabrication of the bulk crystal. As described below, FIG. 2A shows a seed crystal which contains threading dislocations. FIG. 2B shows the seed crystal after etching, showing pits formed in a surface of the seed crystal. FIG. 2C illustrates a metal layer formed on the pitted nitrogen polar c-plane surface, filling the pits with the metal. FIG. 2D shows the seed crystal after forming self-aligned metal masks at the surface termination point of the dislocations. FIG. 2E shows low dislocation bulk GaN crystal after ammonothermal growth.

In the figure each number represents the followings:
1. A first region (a seed crystal),
1a. A dislocation in the seed crystal,
1b. Nitrogen polar surface of c-plane
2. A second region grown in supercritical ammonia,
3. A metal located at the termination point of a dislocation in the interface between the first region and the second region.
4. A pit formed at the termination point of a dislocation on the nitrogen polar surface of c-plane,
5. A metal layer deposited on the nitrogen polar surface of c-plane with pits.

DETAILED DESCRIPTION OF THE INVENTION

Technical Description of the Invention

The low dislocation bulk GaN crystal in this invention is sliced into wafers to produce low dislocation GaN wafers used for various optoelectronic and electronic devices. The bulk GaN crystal is preferably grown in supercritical ammonia. The crystal growth method using supercritical ammonia is called ammonothermal growth. In the ammonothermal growth, a bulk-shaped GaN crystal is grown on a seed crystal. Through our development of ammonothermal growth of bulk GaN crystals, we have discovered several key technologies to obtain a crack-free GaN bulk crystal up to 2 inches using a free-standing HVPE GaN wafer as a seed crystal (e.g. U.S. Pat. No. 9,790,617 and allowed U.S. patent application Ser. No. 15/004,464, each of which is incorporated by reference in its entirety as if put forth in full below).

A seed crystal made by HVPE typically shows dislocation density on the order of $10^6$ cm$^{-2}$. Through our ammonothermal bulk growth of GaN, the dislocation is reduced to the order of $10^5$ cm$^{-2}$. Although the detailed mechanism is unknown, theorists proposed a model where natural annihilation occurs when the thickness of GaN crystal increases [7]. According to this theory, the dislocations move slightly to reduce strain energy caused by the dislocation itself as the thickness increases, and when two dislocations with opposite Berger's vector meet, these two dislocations annihilate one another. However, when the dislocation density becomes on the order of $10^5$ cm$^{-2}$, the annihilation does not occur due to increased separation between two dislocations. When the dislocation density is $1 \times 10^6$ cm$^{-2}$, there is one dislocation in the area of 10 microns×10 microns, so that two adjacent dislocations having the same or opposite Berger's vector are approximately 10 microns from one another. When the dislocation density is $1 \times 10^5$ cm$^{-2}$, the separation of two adjacent dislocations becomes about 30 microns.

As explained above, a GaN wafer formed from bulk GaN grown by the ammonothermal method typically contains dislocations on the order of $10^5$ cm$^{-2}$. Below this level, dislocations do not naturally annihilate. However, to produce semiconductor devices which can handle high-power, dislocation density must be reduced further. Therefore, we have developed a novel technique to terminate dislocations in the seed crystal when a bulk GaN crystal is grown.

Through our development, we found that we can place metallic masks at the surface termination points of threading dislocations on the surface of seed crystals. Note that the masks are not connected together. Rather they are small areas or dots of metals buried at the seed surface. If there are no masks, threading dislocations continue to propagate when additional GaN crystal is grown on the seed surface. The metallic masks inhibit growth of GaN at the termination point of the dislocations; therefore propagation of the dislocations is prevented. As the thickness of grown GaN crystal increases, the masks are buried by overgrown GaN, and the newly grown bulk GaN may contain about 1/10 or less dislocations in total and/or per area than the seed crystals.

FIG. 1 presents the schematic cross section of the bulk GaN crystal in this invention. The seed crystal which is the first region 1 contains threading dislocations 1a. The bulk GaN crystal which is the second region 2 are grown in supercritical ammonia with metal, preferably dot-like masks 3. The metal masks prevent propagation of threading dislocations during ammonothermal growth; therefore the second region of the bulk GaN crystal in this invention contains many fewer dislocations than the first region as shown in FIG. 1.

In the ammonothermal method, a nitrogen polar c-plane-oriented GaN wafer is used as a seed crystal. A seed crystal may contain several kinds of dislocations such as screw dislocations, edge dislocations and mixed dislocations, depending on the method of making the bulk GaN crystal from which the seed crystal was formed. A screw dislocation has a Burger's vector of <0001> and an edge dislocation has a Burger's vector of 1/3<2-1-10>. A mixed dislocation has a Burger's vector consisting of any mixture of a screw component and an edge component. The invention preferably uses seed crystals made by ammonothermal growth although seed crystals made by HVPE, flux method and other methods may be used instead.

Figure 2A:
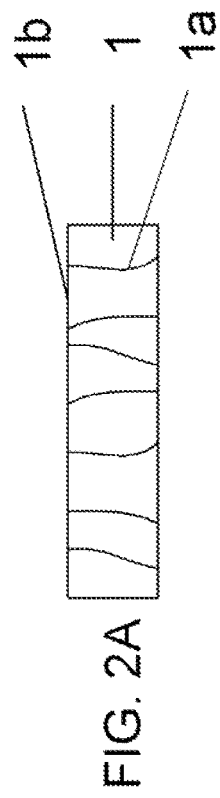
Figure 2B:
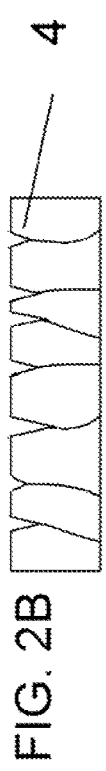

FIG. 2A-E present the process flow to produce a low-dislocation bulk GaN crystal according to the present invention. FIG. 2A shows a seed crystal which is the first region 1. The seed crystal contains threading dislocations 1a. In the ammonothermal growth, nitrogen polar c-plane 1b can be used as the basal plane, or the gallium polar c-plane or other plane can be used as the basal plane if desired. FIG. 2B shows the seed crystal after etching, showing pits 4 formed in a surface of the seed crystal. GaN is reported to be chemically stable, and it is not easily etched in either acid or base. However, Reference [8] reports that nitrogen polar c-plane can be etched slightly in hot phosphoric acid, creating numerous pits on the surface, although these pits are not associated with dislocations. Also, Reference [8] and [9] reports that using eutectic KOH and NaOH mixture can create pits on the nitrogen polar c-plane GaN, and these pits are associated with dislocations. However, according to [9], the pits formation for screw dislocations on the nitrogen polar surface tend to grow fast, and pits tend to cover multiple dislocations.

To overcome this problem, the present invention utilizes a seed crystal having dislocation density less than $10^6$ cm$^{-2}$. With this level of dislocation density, the separation of each dislocation is more than 10 microns, and it is possible to create one pit at the surface termination point of each threading dislocation with the above-mentioned etching method.

One preferred method of the present invention utilizes electrochemical etching, in a preferably dark condition or in filtered lighting with shorter wavelength light that creates electron-hole pairs filtered out. By flowing electric current from GaN seed to electrolyte, it is possible to create pits 4 selectively at the surface termination points of threading dislocations. With this approach, it is not necessary to use strong acid or strong base as electrolyte as is used in references [8] and [9]. An organic acid can be used, for example. Also, it is not necessary to heat the electrolyte, although one may do so if desired. Electrochemical etching can be conducted at room temperature. With controlling etching current and time, cone-shaped pits are created selectively at the termination points of threading dislocations on the nitrogen polar c-plane surface. To avoid forming pits where dislocations do not exist, it is preferable to avoid shining light having a wavelength shorter than 400 nm, preferably shorter than 370 nm, and more preferably shorter than 360 nm on the seed crystal. Light with a wavelength shorter than 370 nm creates electron-hole pair in the seed crystal that promotes chemical etching, and this light can form excess pits at random locations where dislocations are not present.

Figure 2C:
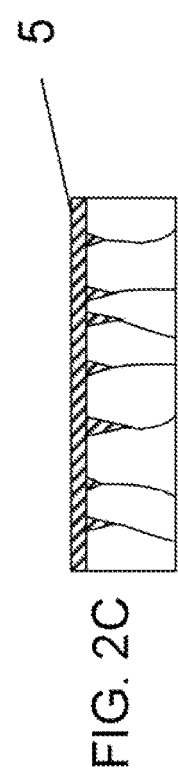

Next, a metal layer 5 as depicted in FIG. 2C is formed on the pitted nitrogen polar c-plane surface to fill the pits with the metal. FIG. 2C shows the cross-sectional view after metal deposition. Metal can be deposited by various methods such as vacuum thermal evaporation, vacuum electron beam evaporation, sputtering, and electro-plating. In the present invention silver is preferably used although other metals such as nickel, vanadium, and platinum can be used as long as the metal withstands corrosion by supercritical ammonia. It is preferable to fill the pits entirely so that after planarizing the surface to expose GaN and remove most of the metal layer, the GaN of the nitrogen polar c-plane and the tops of the metal masks are part of the same plane. The filled pits therefore appear as dots of metal on the surface of the GaN seed.

Since pit formation by chemical or electrochemical etching tends to be affected by various non-uniformity factors such as concentration of etching solution/electrolyte and electric current density, pits size tends to be non-uniform. The maximum size of the pits is preferably 10 microns so that two adjacent pits do not touch each other, and minimum size of the pits is preferably 0.01 microns so that all metal fillings will remain in the pits after removal of metal layer. It is preferable to keep the etching time short so that the pit depth becomes as small as possible. This way, metal filling can be completed with deposition of a thin metal layer, and pit width is small so that new GaN deposited above the pits (coated with metal as described below) grows without new defects in the new GaN growth.

Figure 2D:

Standard mechanical methods such as grinding and lapping can be used to remove most of the metal layer and planarize the wafer's basal surface. After removing the metal layer on the nitrogen polar c-plane surface, metal masks (or fillings) 3 of FIG. 2D are left only inside the pits. As explained above, the top of the metal fillings and the surface of the nitrogen polar c-plane are preferably made flat with height difference less than 1 micron, although a greater height difference is possible depending on the amount of metal deposited when forming metal layer 5. The nitrogen polar c-plane is preferably polished with chemical mechanical polishing (CMP) to remove surface and subsurface damage. FIG. 2D shows the seed crystal after forming self-aligned metal masks 3 at the surface termination point of the dislocations.

Alternatively, metal masks can be formed selectively in the pits by the following method. First, cover the pitted surface with metal powder. Then, by shaking the wafer and/or gently blowing excess powder from the surface using e.g. dry air or an inert gas such as nitrogen, excess powder particles are removed from the surface, selectively leaving the metal powder in the pits. The seed wafer is annealed to fuse the metal particles and form metal masks selectively in the pits by providing a coating over pit sidewalls and/or filling the pits with fused metal particles. As discussed previously, a metal that is essentially nonreactive in ammonothermal growth conditions is preferably used. The particle size of the powder should be quite small so that a sufficient number of metal particles deposit within pits that have a size between about 0.01 to 10 microns to coat sidewalls and/or fill the pits during anneal. Silver nano-powder having an average particle size of 0.5-1 micron may be used, for instance, as may gold or nickel nano-powder of the same average particle size. Naturally, if the particle size distribution of metal particles is small, the average particle size of the powder is preferably smaller in order to fill the small pits in addition to the larger pits. The person of ordinary skill can select particle size and annealing conditions based on the information herein.

The pitted wafer with metal masks in its pits may, in either of the methods discussed above, be planarized as discussed previously. Alternatively, the annealed wafer may be used as a seed with only partial planarization (e.g. grinding; grinding and lapping; or grinding, lapping, and mechanical polishing) or without any planarization (i.e. no grinding, lapping, mechanical polishing, or CMP).

Figure 2E:
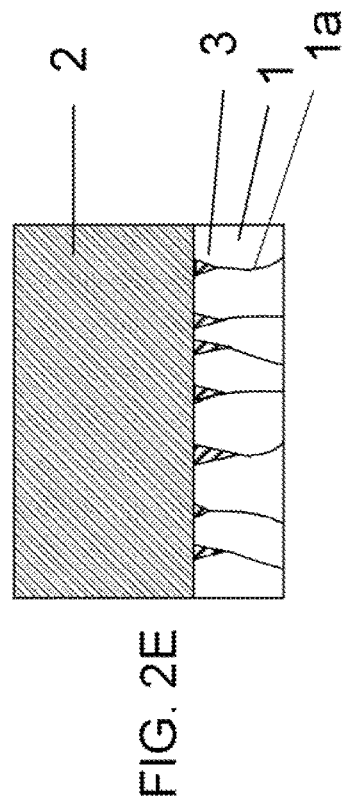

Using the seed crystal with metal masks explained above, bulk GaN 2 of FIG. 2E is grown in supercritical ammonia until at least the metal masks are covered with GaN. FIG. 2E shows low dislocation bulk GaN crystal 2 after ammonothermal growth.

EXAMPLE 1

A GaN seed crystal made by the ammonothermal method having a dislocation density of about $2 \times 10^5$ cm$^{-2}$ is prepared. A copper wire is soldered with indium on the gallium polar surface of the seed crystal. The etching is conducted in a yellow room where light with wavelength shorter than 450 nm is filtered from a white light source. The entire seed crystal is immersed in a mild acid such as a 0.3M aqueous oxalic acid solution. A platinum electrode is also immersed in the oxalic acid solution. The copper wire is connected to the positive side and the platinum electrode is connected to the negative side of a DC power supply. The voltage is increased to 30 V, allowing electrochemical etching for a few minutes. After etching, pits are formed at the surface termination points of essentially all threading dislocations on the surface of nitrogen polar c-plane. Since pit formation by chemical or electrochemical etching tends to be affected by various non-uniformity factors such as concentration of etching solution/electrolyte and electric current density, pits size tends to be non-uniform. The maximum size of the pits is preferably 10 microns so that two adjacent pits do not touch each other, and minimum size of the pits is preferably 0.01 microns so that all metal fillings will remain in the pits after removal of metal layer. It is preferable to keep the etching time short so that the pit depth becomes as small as possible. This way, metal filling can be completed with deposition of a thin metal layer, and pit width is small so that new GaN deposited above the pits (coated with metal as described below) grows without new defects in the new GaN growth.

Then, the copper wire is removed from the seed crystal. The excess indium on the gallium polar surface is removed with a knife and the seed crystal is etched in 10% aqueous hydrochloric acid (HCl) to remove the residual indium. Even after the HCl etching, there is essentially no change on the surface of GaN seed, i.e. no extra pits are formed. The seed crystal is then rinsed with de-ionized water followed by drying with nitrogen blow. After appropriate degreasing and cleaning of the seed crystal, it is loaded into an electron beam (E-beam) evaporator. Approximately 0.5 micron-thick silver layer is deposited on the nitrogen polar c-plane surface to fill the pits entirely.

The silver coated seed crystal is mounted on a polishing plate. First the top layer of silver is removed with grinding, leaving cone shaped metal masks at the termination point of essentially all dislocations. Therefore, the unmasked region on the surface of c-plane GaN seed does not essentially have a surface termination point of a dislocation. The tips of the cones points toward the seed crystal, and the bases of the cones are aligned to the top nitrogen polar surface of the seed. Then, the seed crystal with exposed nitrogen polar c-plane is lapped, polished and CMP-ed to remove surface and subsurface damage. After CMP, the surface is preferably practically flat with height difference less than 1 micron.

The metal masked seed crystal is loaded in an ammonothermal growth reactor and bulk GaN crystal is grown by the ammonothermal method as disclosed in e.g. U.S. Pat. No. 8,236,267, which is incorporated by reference in its entirety as if put forth in full below. By terminating the threading dislocations from the seed crystal, the grown bulk GaN crystal shows dislocation density ⅒ or less than that of seed crystal. Then, the bulk GaN crystal is sliced, ground, lapped, polished and CMP-ed to produce GaN wafers.

EXAMPLE 2

A GaN seed crystal made by the ammonothermal method having a dislocation density of about $2\times10^5$ cm$^{-2}$ is prepared. Both the Ga surface and the N surface of the seed crystal are finished with CMP. The etching is conducted in a eutectic solution of KOH and NaOH at about 250° C. The entire seed crystal is immersed in the solution for about 30 seconds. The temperature can be 200 to 400° C. and the time can be 1 to 300 second. After etching, pits are formed at the surface termination points of essentially all threading dislocations on the surface of nitrogen polar c-plane. The maximum size of the pits is preferably 10 microns so that two adjacent pits do not touch each other, and minimum size of the pits is preferably 0.01 microns so that all metal fillings remain in the pits.

After rinsing the wafer in de-ionized water followed by drying with nitrogen blow, the N surface of the wafer is covered with silver nano-powder having an average particle size of 0.5-1 micron. Then, by shaking the wafer, excess silver powder is removed from the surface, leaving silver powder particles selectively in the pits. The GaN sample with silver powder in pits is baked in an oven at temperature between 150 and 450° C. Silver powder in the pits form silver masks in the pits.

The metal masked seed crystal is loaded in an ammonothermal growth reactor and bulk GaN crystal is grown by the ammonothermal method as disclosed in e.g. U.S. Pat. No. 8,236,267, which is incorporated by reference in its entirety as if put forth in full below. By terminating the threading dislocations from the seed crystal, the grown bulk GaN crystal has dislocation density 1/10 or less than that of seed crystal. Then, the bulk GaN crystal is sliced, ground, lapped, polished and CMP-ed to produce GaN wafers.

Advantages and Improvements

The low-dislocation bulk GaN crystal in this invention enables to produce low-dislocation GaN wafers for various optoelectronic and electronic devices. By reducing the dislocation density below $10^5$ cm$^{-2}$, these optoelectronic and electronic devices can operate at higher power density than the current devices.

Possible Modifications

Although the example describes seed crystals made by the ammonothermal method, seed crystals made by other methods such as HVPE, flux method and high-pressure solution growth can be used.

Although the example describes using oxalic acid as electrolyte, other organic acid such as acetic acid, formic acid, propionic acid, citric acid, and carbonic acid can be used as electrolyte.

Although the preferred embodiment describes silver as the mask metal, other metals such as silver alloy, nickel and its alloy, vanadium and its alloy, platinum and its alloy can be used.

Although the preferred embodiment describes a seed crystal with dislocation density on the order of $10^5$ cm$^{-2}$, a seed crystal with lower dislocation density such as $10^4$ cm$^{-2}$ or $10^3$ cm$^{-2}$ can be used Although the preferred embodiment describes a specific mechanical method of removing the metal layer, other methods such as sand blasting can be used as long as the final surface is sufficient planar (for example, within 1 micron difference in height).

One can of course provide one or more intermediate group III nitride layers between the bulk GaN crystal and the seed if desired. It is therefore not necessary to have the new bulk GaN crystal in direct contact with the seed and pits to grow bulk GaN on the seed crystal and masked pits.

One method of forming masks at dislocations is described above, although other methods may be used. An alternative method includes mapping positions of dislocations on a seed's surface using e.g. an electron microscope, forming a mask that exposes the mapped locations for that particular seed, etching the exposed GaN at the dislocations using e.g. ME or other etching method, depositing individual masks upon the etched dislocations by e.g. sputtering metal on the masked and etched surface, and removing the original mask and much of the deposited metal so that the seed with individual masks over dislocations can be planarized sufficiently for subsequent growth of bulk GaN on the resultant seed.

What is claimed is:

1. A method of fabricating a GaN crystal in supercritical ammonia comprising
   (a) etching a nitrogen polar c-plane surface of a GaN seed crystal to selectively form pits at surface termination points of dislocations,
   (b) forming metal masks upon surfaces of the pits, wherein the step of forming the metal masks comprises
      (1) depositing metal powder particles on the nitrogen polar c-plane surface of the GaN seed crystal having pits,
      (2) removing an excess amount of the metal powder particles from the surface, thereby leaving a quantity of the metal powder particles in the pits, and
      (3) annealing the GaN seed with the metal powder particles to form metal masks in the pits, and
   (c) growing a GaN crystal on the GaN seed crystal and above the metal masks in supercritical ammonia.

2. A method of fabricating a GaN crystal according to claim 1, wherein at least some of the pits formed on the nitrogen polar c-plane surface of the GaN seed crystal have a cone shape.

3. A method of fabricating a GaN crystal according to claim 1, wherein the pits are formed by immersing the GaN seed crystal in an electrolyte and flowing electric current from the GaN seed crystal to the electrolyte.

4. A method of fabricating a GaN crystal according to claim 3, wherein the electrolyte comprises an organic acid.

5. A method of fabricating a GaN crystal according to claim 3, wherein the electrolyte comprises oxalic acid.

6. A method of fabricating a GaN crystal according to claim 3, wherein the pits are formed in a dark environment by avoiding light irradiation to the GaN seed crystal.

7. A method of fabricating a GaN crystal according to claim 3, wherein the pits are formed by avoiding irradiation of light having a wavelength shorter than 400 nm.

8. A method according to claim 7, wherein the wavelength is shorter than 370 nm.

9. A method of fabricating a GaN crystal according to claim 1, wherein the pits are formed by immersing the GaN seed crystal in molten KOH, NaOH or a eutectic solution of KOH and NaOH.

10. A method according to claim 1, wherein the metal powder particles comprise silver particles.

11. A method according to claim 1, wherein the seed crystal was formed from a bulk crystal formed by ammonothermal deposition directly upon a crystal formed by HVPE.

12. A method according to claim 1, wherein the seed has a dislocation density of less than $10^6$ cm$^{-2}$.

13. A method according to claim 1, wherein each of the pits at the surface termination points of dislocations is greater than 10 microns from other of the pits at the surface termination points of dislocations.

14. A method according to claim 1, wherein the pits are formed by electromechanically etching the seed crystal, and the etchant and the light incident upon the GaN seed crystal are selected to avoid forming excess pits at locations on the surface of the GaN seed crystal that are not associated with the dislocations.

15. A method according to claim 1, wherein the GaN seed crystal is not planarized between the step of forming the metal masks and the step of growing the GaN crystal on the GaN seed crystal.

\* \* \* \* \*